US008957467B2

(12) United States Patent
Uchiyama

(10) Patent No.: US 8,957,467 B2
(45) Date of Patent: Feb. 17, 2015

(54) METHOD OF FABRICATING A SEMICONDUCTOR DEVICE

(75) Inventor: Hiroyuki Uchiyama, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/197,268

(22) Filed: Aug. 3, 2011

(65) Prior Publication Data

US 2011/0284941 A1 Nov. 24, 2011

Related U.S. Application Data

(60) Division of application No. 12/987,695, filed on Jan. 10, 2011, now abandoned, which is a continuation of application No. 12/180,612, filed on Jul. 28, 2008, now abandoned.

(30) Foreign Application Priority Data

Jul. 27, 2007 (JP) ................................. 2007-195861

(51) Int. Cl.
| | |
|---|---|
| *H01L 27/108* | (2006.01) |
| *H01L 49/02* | (2006.01) |
| *H01L 21/822* | (2006.01) |
| *H01L 27/06* | (2006.01) |

(52) U.S. Cl.
CPC .......... *H01L 28/90* (2013.01); *H01L 27/10814* (2013.01); *H01L 27/10852* (2013.01); *H01L 21/8221* (2013.01); *H01L 27/0688* (2013.01)
USPC ............ 257/311; 257/E21.656; 257/E21.657; 257/E21.658; 257/306

(58) Field of Classification Search
USPC .......... 257/301, 306, 311, E21.656, E21.657, 257/E21.658; 25/303, 311
See application file for complete search history.

(56) References Cited

U.S. PATENT DOCUMENTS

| | | | |
|---|---|---|---|
| 6,300,652 B1 | 10/2001 | Risch et al. | |
| 2002/0173111 A1* | 11/2002 | Kasai | 438/396 |
| 2003/0025142 A1* | 2/2003 | Rhodes et al. | 257/301 |
| 2006/0186449 A1 | 8/2006 | Uchiyama | |
| 2009/0087958 A1 | 4/2009 | Uchiyama | |

FOREIGN PATENT DOCUMENTS

| | | |
|---|---|---|
| JP | 09-153599 | 6/1997 |
| JP | 2003-163287 | 6/2003 |
| JP | 2004-071759 | 3/2004 |
| JP | 2006-216649 | 8/2006 |
| WO | WO 03/052829 | 6/2003 |

OTHER PUBLICATIONS

Machine Translation of Applicant Submitted Art Shimada JP 2004-71759.*

* cited by examiner

*Primary Examiner* — Amar Movva
(74) *Attorney, Agent, or Firm* — Young & Thompson

(57) ABSTRACT

A semiconductor device includes: a transistor including source and drain diffusion-layers, a gate insulating film and a gate electrode; first and second plugs formed in a first interlayer-insulating film and connected to the source and drain diffusion-layers, respectively; a third plug extending through a second interlayer-insulating film and connected to the first plug; a first interconnection-wire formed on the second interlayer-insulating film and connected to the third plug; a second interconnection-wire formed on a third interlayer-insulating film and intersecting the first interconnection-wire; a fourth interlayer-insulating film; a hole extending through the fourth, third and second interlayer-insulating films, the hole being formed such that a side surface of the second interconnection-wire is exposed; and a fourth plug filling the hole via an intervening dielectric film and connected to the second plug, wherein a capacitor is formed using the fourth plug, the second interconnection-wire and the dielectric film sandwiched therebetween.

6 Claims, 11 Drawing Sheets

METHOD OF FABRICATING A SEMICONDUCTOR DEVICE

BACKGROUND OF THE INVENTION

1. Field of the Invention

The present invention relates to a semiconductor device and a method of fabricating the same.

2. Description of the Related Art

In conventional DRAM (Dynamic Random Access Memory) of the STC (Stacked Capacitor Cell) type, a capacitor has been made to have a three-dimensional structure, thus having an increased surface area in the height direction, in order to compensate for a decrease in the electric capacitance of the capacitor with miniaturization. The capacitor accordingly has a section with an increased aspect ratio and the device structure is complicated. Thus, it has been difficult to fabricate the device and to ensure both of a required capacitance and a satisfactory yield compatibly. An exemplary conventional capacitor structure is disclosed in Japanese Patent Laid-Open No. 2004-71759.

On the other hand, the number of interconnection layers is increasing as the capability and the performance of a semiconductor device become higher. When a multi-level interconnection structure is formed after the formation of a capacitor extended in the height direction, the yield tends to lower. Also, this manner of forming such a multi-level interconnection structure results in the addition of a process dedicated to the formation of memory cells to the logic formation process in the fabrication of a logic device with embedded DRAM. Thus, an increase in cost relative to the basic process cost and a decrease in yield are unavoidable.

In a sectional structure of conventional DRAM as shown in FIG. 11A and FIG. 11B, a capacitor element is formed in a memory cell region (shown in FIG. 11A) to effectively utilize the space thereof, whereas only a through-hole and a via plug filling the through-hole are present in a layered region of a peripheral circuit region (FIG. 11B) corresponding to a capacitor element forming region of the memory cell region and, hence, space utilization efficiency is low.

As described above, the capacitor element of DRAM needs to have a capacitor structure which is enlarged in the height direction in order to ensure a required storage capacitance, as the storage capacitance becomes insufficient with miniaturization. Accordingly, the proportion of the region in which only the through-hole extends has increased in the peripheral circuit region generation by generation, which forms a factor in lowering the performance of the basic device, such as an increase in through-hole resistance.

Since a signal line and other interconnection wires including a source line cannot extend through the capacitor region of a conventional memory cell, the formation of interconnection wires have to be conducted independently after the completion of the capacitor. For this reason, it is difficult to provide the peripheral circuit with a necessary and sufficient number of interconnection layers. Thus, the performance of the peripheral circuit cannot sufficiently be improved.

In addition, separate formations of the capacitor and the interconnection wires constitute a cost increasing factor.

For the reasons stated above, it is difficult to realize a logic LSI with a large-capacity embedded DRAM at a low cost.

SUMMARY OF THE INVENTION

An object of the present invention is to provide a semiconductor device having memory of a sufficient capacity and a high-density structure which can be formed easily.

According to the present invention, there are provided the following semiconductor devices and methods of fabricating the same:

(1) A semiconductor device including:
- a transistor including source and drain diffusion layers formed on a semiconductor substrate, and a gate electrode formed on a gate insulating film on a region of the semiconductor substrate between the source and drain diffusion layers;
- a first interlayer insulating film covering the transistor;
- a first conductive plug filling a first hole formed in the first interlayer insulating film, the first conductive plug being connected to one of the source and drain diffusion layers;
- a second conductive plug filling a second hole formed in the first interlayer insulating film, the second conductive plug being connected to the other of the source and drain diffusion layers;
- a second interlayer insulating film covering the first conductive plug and the second conductive plug;
- a third conductive plug filling a third hole extending through the second interlayer insulating film, the third conductive plug being connected to the first conductive plug;
- a first interconnection wire connected to the third conductive plug, the first interconnection wire being extending in a first direction;
- a third interlayer insulating film covering the first interconnection wire;
- a second interconnection wire extending in a second direction intersecting the first direction;
- a fourth interlayer insulating film covering the second interconnection wire;
- a fourth hole extending through the fourth, third and second interlayer insulating films to reach the second conductive plug, the fourth hole being formed such that a side surface of the second interconnection wire is exposed;
- a dielectric film formed on an inner wall of the fourth hole; and
- a fourth conductive plug filling the fourth hole, the fourth conductive plug being connected to the second conductive plug, wherein a capacitor is formed using the fourth conductive plug, the second interconnection wire and the dielectric film sandwiched therebetween.

(2) The semiconductor device according to the above item (1), further including:
- a third interconnection wire formed just above the first interconnection wire, the third interconnection wire extending in the first direction; and
- a fifth interlayer insulating film covering the third interconnection wire, wherein the fourth hole extends through the fifth, fourth, third and second interlayer insulating films to reach the second conductive plug, the fourth hole exposing side surfaces of the third and second interconnection wires; and another capacitor is further formed using the fourth conductive plug, the third interconnection wire and the dielectric film sandwiched therebetween form a further capacitor.

(3) The semiconductor device according to the above item (1), wherein a memory cell array is formed using a memory cell including the transistor and the capacitor, a word line forming the gate electrode, and a bit line forming the first interconnection wire, the memory cell, the word line and the bit line being disposed in a matrix arrangement;

the second interconnection wire extends just above the word line so as to be superposed thereabove;

the second conductive plug has a portion extended into a region free of the first and second interconnection wires in a substrate plane, and the fourth conductive plug is disposed so as to connect to the extended portion of the second conductive plug.

(4) The semiconductor device according to the above item (2), wherein a memory cell array is formed using a memory cell including the transistor and the capacitor, a word line forming the gate electrode, and a bit line forming the first interconnection wire, the memory cell, the word line and the bit line being disposed in a matrix arrangement, the second interconnection wire extends just above the word line so as to be superposed thereabove;

the third interconnection wire extends just above the bit line so as to be superposed thereabove;

the second conductive plug has a portion extended into a region free of the first, second and third interconnection wires in a substrate plane; and the fourth conductive plug is disposed so as to connect to the extended portion of the second conductive plug.

(5) The semiconductor device according to the above item (3) or (4), wherein the second conductive plug has portions extended in the substrate plane toward opposite sides in the second direction; and the fourth conductive plug includes conductive plugs opposed across the first interconnection wire, one of the conductive plugs being connected to one extended portion of the second conductive plug, and the other of the conductive plugs being connected to the other extended portion of the second conductive plug.

(6) The semiconductor device according to the above item (1) or (3), wherein a memory cell array is formed using a memory cell including the transistor and the capacitor, a word line forming the gate electrode, and a bit line forming the first interconnection wire, the memory cell, the word line and the bit line being disposed in a matrix arrangement;

the semiconductor device further includes a peripheral circuit including a transistor including source and drain diffusion layers formed on the semiconductor substrate, and a gate electrode formed on a gate insulating film on a region of the semiconductor substrate between the source and the drain diffusion layers; and a region containing the peripheral circuit includes an interconnection wire formed using the same material as the first interconnection wire on the second interlayer insulating film; and an interconnection wire formed using the same material as the second interconnection wire on the third interlayer insulating film.

(7) The semiconductor device according to the above item (2) or (4), wherein a memory cell array is formed using a memory cell including the transistor and the capacitor, a word line forming the gate electrode, and a bit line forming the first interconnection wire, the memory cell, the word line and the bit line being disposed in a matrix arrangement;

the semiconductor device further includes a peripheral circuit including a transistor including source and drain diffusion layers formed on the semiconductor substrate, and a gate electrode formed on a gate insulating film on a region of the semiconductor substrate between the source and drain diffusion layers, and a region containing the peripheral circuit includes an interconnection wire formed using the same material as the first interconnection wire on the second interlayer insulating film, an interconnection wire formed using the same material as the second interconnection wire on the third interlayer insulating film, and an interconnection wire formed using the same material as the third interconnection wire on the fourth interlayer insulating film.

(8) A method of fabricating a semiconductor device, including:

forming a memory cell transistor on a semiconductor substrate, the memory cell transistor including source and drain diffusion layers, and a gate electrode formed on a gate insulating film on a region of the semiconductor substrate between the source and drain diffusion layers;

forming a first interlayer insulating film covering the transistor;

forming first and second holes in the first interlayer insulating film and then forming first and second conductive plugs filling the first and second holes, respectively, the first conductive plug being connected to one of the source and the drain diffusion layers of the transistor, the second conductive plug being connected to the other of the source and drain diffusion layers;

forming a second interlayer insulating film covering the first and second conductive plugs;

forming a third hole extending through the second interlayer insulating film and then forming a third conductive plug filling the third hole, the third conductive plug being connected to the first conductive plug;

forming a first interconnection wire connected to the third conductive plug, the first interconnection wire being extending in a first direction;

forming a third interlayer insulating film covering the first interconnection wire;

forming a second interconnection wire extending in a second direction intersecting the first direction;

forming a fourth interlayer insulating film covering the second interconnection wire;

forming a fourth hole extending through the fourth, third and second interlayer insulating films to reach the second conductive plug, such that a side surface of the second interconnection wire is exposed;

forming a dielectric film on an inner wall of the fourth hole; and forming a fourth conductive plug filling the fourth hole, the fourth conductive plug being connected to the second conductive plug, whereby a capacitor is formed using the fourth conductive plug, the second interconnection wire and the dielectric film sandwiched therebetween.

(9) The method of fabricating a semiconductor device according to the above item (8), further comprising:

forming a peripheral circuit transistor on the semiconductor substrate, the peripheral circuit transistor including source and drain diffusion layers, and a gate electrode formed on a gate insulating film on a region of the semiconductor substrate between the source and drain diffusion layers;

forming a first peripheral circuit interconnection wire on the second interlayer insulating film simultaneously with the formation of the first interconnection wire, using the same material as the first interconnection wire, the first peripheral circuit interconnection wire being electrically connected to the peripheral circuit transistor; and forming a second peripheral circuit interconnection wire on the third interlayer insulating film simultaneously with the formation of the second interconnection wire, using the same material as the second interconnection wire, the second peripheral circuit interconnection wire being electrically connected to the peripheral circuit transistor.

According to the present invention, it is possible to provide a semiconductor device having memory of a sufficient capacity and a high-density structure which can be formed easily.

DETAILED DESCRIPTION OF THE PREFERRED EMBODIMENTS

Figure 1:
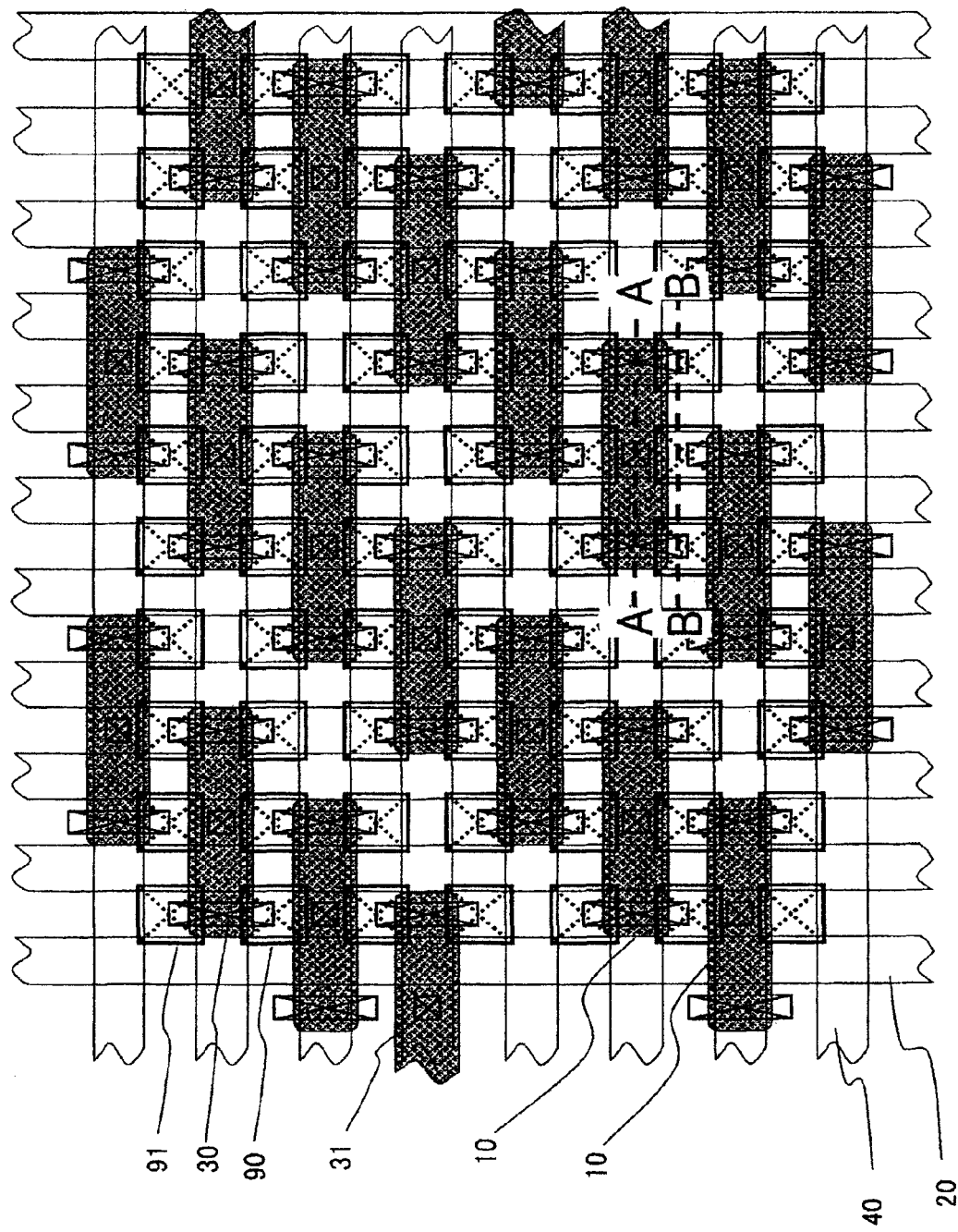
FIG. 1 is a plan view showing a layout of a memory cell array region in a semiconductor device according to one exemplary embodiment of the present invention.

Hereinafter, an exemplary embodiment of the present invention will be described.

A semiconductor device in accordance with the present embodiment has a structure that includes a layered region in which a capacitor element is formed (i.e., capacitor region), and in the capacitor region, an interconnection layer is formed such that the interconnection layer is utilized as a counter electrode of the capacitor element. The semiconductor device can accordingly ensure a sufficient storage capacitance and an increased density compatibly.

In a DRAM capacitor of the device in accordance with the present embodiment, an exclusive electrode common to all the cells is not used as a counter electrode, which is opposed to a storage electrode, but an interconnection wire extending through the capacitor region is used as the counter electrode. Accordingly, this interconnection wire can be utilized as an interconnection wire in a peripheral circuit region as well. For this reason, a necessary interconnection wire can be provided in the region in which only a through-hole having a high aspect ratio and a via plug filling the through-hole have conventionally been present as extending therethrough. Since this interconnection wire extends in the capacitor region as well, space utilization efficiency is improved. For this reason, it is possible to lower the height of the semiconductor device as a whole and reduce the cost by improvement in yield and limited consumption of materials.

In the present embodiment, an exclusive voltage common to all the cells is not used as an operating voltage to be applied to the counter electrode of the DRAM capacitor element, but different voltages can be applied to individual interconnection wires forming counter electrodes. In the conventional structure, interconnection wires to be individually applied with different voltages are formed over a memory cell region after the formation of a capacitor. By contrast, the present embodiment allows such interconnection wires to directly extend through the capacitor region and to be utilized in the peripheral circuit. For this reason, the peripheral circuit can be provided with necessary and sufficient interconnection wires and hence can be improved in its performance.

Further, it becomes possible to suppress a reduction in reliability and yield and an increase in through-hole resistance in the peripheral circuit region due to the capacitor element with its profile becoming higher with miniaturization.

In the fabrication of the semiconductor device thus constructed according to the present embodiment, the memory cell forming process and the peripheral circuit forming process have enhanced compatibility therebetween and, hence, an LSI with a large-capacity embedded DRAM can be realized easily.

In addition, a memory cell layout can be formed using a simple pattern having straight lines perpendicularly intersecting each other, which leads to improvement in processability and yield.

Hereinafter, an exemplary semiconductor device in accordance with the present embodiment will be described with reference to the drawings.

Figure 2:
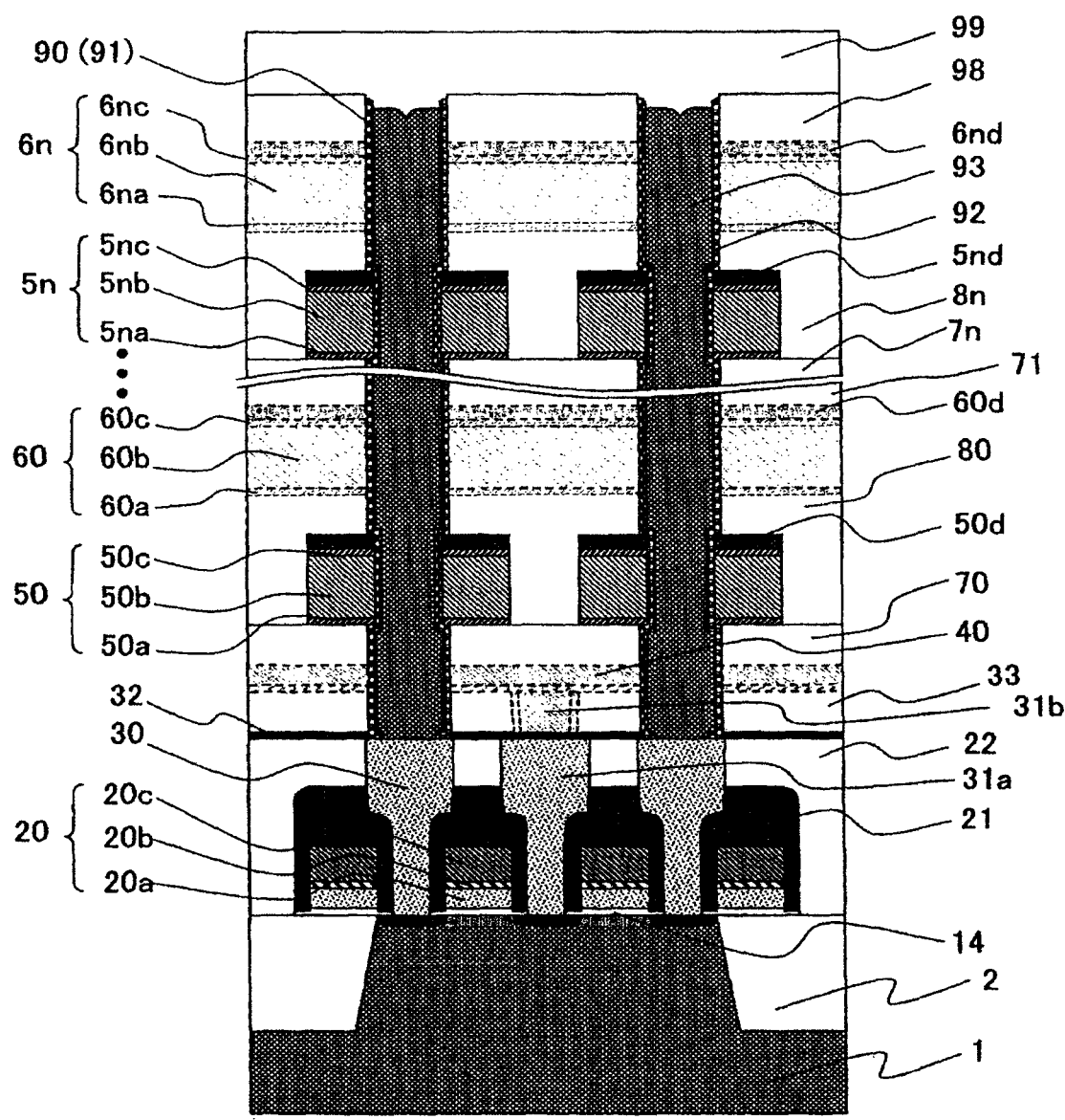
FIG. 2 is a sectional view showing a memory cell region according to the embodiment of the present invention.
Figure 3:
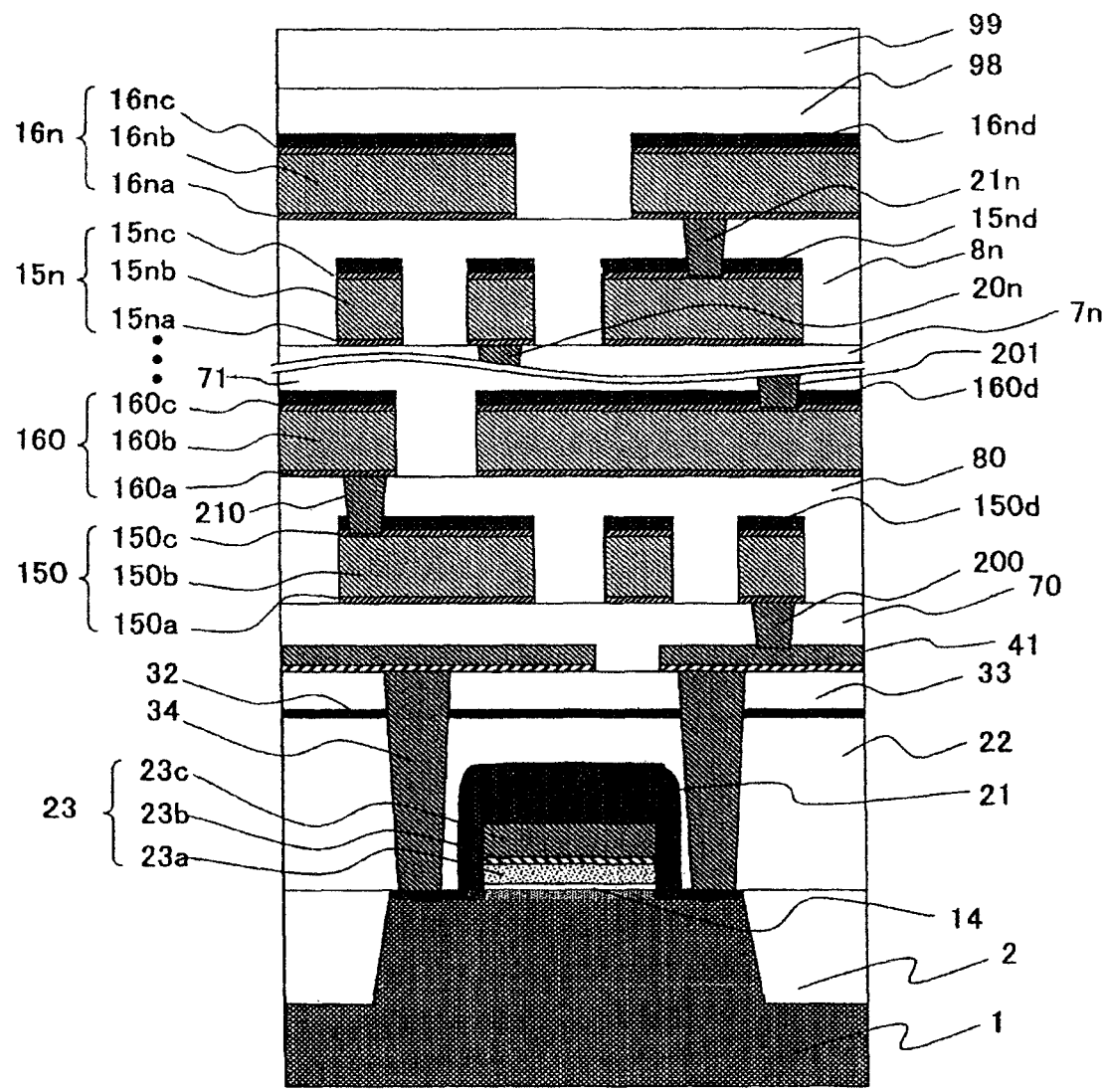
FIG. 3 is a sectional view showing a peripheral circuit region according to the embodiment of the present invention.

FIG. 1 is a plan view showing a layout of a memory cell array region in a semiconductor device in accordance with the present embodiment. FIG. 2 is a fragmentary sectional view showing the memory cell array shown in FIG. 1. In FIG. 2, the section extending from a silicon substrate 1 to an interlayer insulating film 22 is taken on line A-A of FIG. 1, while the section extending from a silicon nitride film 32 to the uppermost layer is taken on line B-B of FIG. 1. In the sectional view taken on line B-B, there are transparently shown a bit line contact plug (upper portion) 31b, a bit line 40, and intracellular interconnection wires 60 and 6n. FIG. 3 is a sectional view showing a structure of a peripheral circuit region in accordance with the present embodiment, though a corresponding plan view is not provided herein.

In FIG. 1, active regions 10 isolated from each other by an element isolation region are regularly arranged in a substrate plane. Word lines 20, each of which includes MOS transistor gate electrodes formed integrally with an interconnection wire interconnecting these gate electrodes, extend in a direction perpendicularly intersecting the direction in which each of the active regions extends. Bit lines (i.e., data lines) 40 for transmitting information from memory cells extend in a direction perpendicularly intersecting the word lines.

A required number of intracellular interconnection wires (which perpendicularly intersect the bit lines) 50 and 5n (where n is the number of further required interconnection layers in addition to the interconnection wires 50) are disposed in a pattern similar to that of the word lines 20, while a required number of intracellular interconnection wires (which perpendicularly intersect the word lines) 60 and 6n (where n is the number of further required interconnection layers in addition to the interconnection wires 60) are disposed in a pattern similar to that of the bit lines 40. The intracellular interconnection wires 50 and 5n each extend just above a respective one of the word lines 20 so as to be superposed thereabove, while the intracellular interconnection wires 60 and 6n each extend just above a respective one of the bit lines 40 so as to be superposed thereabove.

A bit line contact plug 31 for connection to an associated bit line is disposed centrally on each active region 10. Capacitor contact plugs 30 for connection to a capacitor storing information therein are disposed at opposite ends of the same active region. In the substrate plane (i.e., layout plane), each of the capacitor contact plugs 30 has an elongated pattern extended toward opposite sides in the word line direction into regions which are free of the bit lines 40, intracellular interconnection wires 50 and 5n and intracellular interconnection wires 60 and 6n. In the substrate plane, capacitor hole patterns 90 and 91 are provided for each capacitor contact plug 30 so as to be located in respective regions free of the bit lines 40, intracellular interconnection wires 50 and 5n and intracellular interconnection wires 60 and 6n on opposite sides (i.e., upper side and lower side in the figure) across the associated bit line 40. The hole pattern 90 connected to one extended portion of one capacitor contact plug 30 and the hole pattern 91 connected to the other extended portion form a 1-bit cell. In each of the holes corresponding to the hole patterns 90 and 91, a storage electrode 93 is formed on an intervening capacitive insulating film 92.

In a conventional DRAM cell, a common electrode covering the whole memory cell array is provided as counter electrodes of capacitors. In the present embodiment, by contrast, the intracellular interconnection wires 50, 5n, 60 and 6n serve as counter electrodes, and a multiplicity of such counter electrodes are present independently in the form of interconnection wires. All of the intracellular interconnection wires may be at a reference potential. The present embodiment allows the interconnection wires to be used selectively in accordance with the purpose of an LSI product using such DRAM cells in order to optimize the amount of signals in the memory cells. For example, 50% of the interconnection wires are used as reference potential lines, 30% of the interconnection wires used as other source lines, and 20% of the interconnection wires used as signal lines.

As shown in FIG. 2, the word lines 20, each including a polysilicon layer 20a, a tungsten nitride layer 20b and a tungsten layer 20c, are formed on a P-type silicon substrate 1. Each of these word lines functions as a gate electrode on each active region. An N-type MOS transistor is formed which includes the gate electrode, a gate insulating film (silicon oxide film) 14, a channel region, an N-type low-concentration diffusion layer, and an N-type high-concentration diffusion layer.

In the space defined between adjacent word lines 20, the contact plug 30 connected to the high-concentration diffusion layer is formed for connection to the capacitor element, and a contact plug (lower portion) 31a connected to the high-concentration diffusion layer is formed for connection to the associated bit line. Each of these contact plugs may be formed of polysilicon containing an impurity.

The contact plug 31a for connection to a bit line is connected to the associated bit line 40 via the contact plug (upper portion) 31b formed in an upper interlayer insulating film 33, the contact plug 31b having a stacked structure including a titanium nitride film and a tungsten film for example.

The bit lines 40 are each formed of a film stack including a titanium nitride film and a tungsten film for example. An interlayer insulating film 70 is formed over the bit lines 40, and the intracellular interconnection wires 50 perpendicularly intersecting the bit lines are formed on the interlayer insulating film. The intracellular interconnection wires 50 are each formed of a film stack including a titanium nitride film 50a, an aluminum film 50b and a titanium nitride film 50c for example. A silicon nitride film 50d is formed on this film stack. An interlayer insulating film 80 is formed over the intracellular interconnection wires 50. The intracellular interconnection wires 60 each formed of a film stack including a titanium nitride film 60a, an aluminum film 60b and a titanium nitride film 60c for example are formed on the interlayer insulating film 80. A silicon nitride film 60d is formed on this film stack. The intracellular interconnection wires 60 are formed so as to perpendicularly intersect the intracellular interconnection wires 50, i.e., so as to perpendicularly intersect the word lines 20.

Further, interlayer insulating films 7n and 8n (where n is the number of further required layers) and the intracellular interconnection wires 5n and 6n are sequentially formed in accordance with the number of required interconnection layers. The intracellular interconnection wires 5n and the intracellular interconnection wires 6n intersect each other perpendicularly in the layout plane. Each of the intracellular interconnection wires 5n may be formed of a film stack including a titanium nitride film 5na, an aluminum film 5nb and a titanium nitride film 5nc. Similarly, each of the intracellular interconnection wires 6n may be formed of a film stack including a titanium nitride film 6na, an aluminum film 6nb and a titanium nitride film 6nc. Silicon nitride films 5nd and 6nd are formed on the respective film stacks.

In the layout plane, holes (corresponding to the capacitor hole patterns 90 and 91) are each opened to form an opening covering each region free of the bit lines 40 and the intracellular interconnection wires 50, 5n, 60 and 6n (i.e., region in which the space between adjacent bit lines and the space between adjacent intracellular interconnection wires in each layer overlap each other). A film stack including an aluminum oxide film and a hafnium oxide film for example is formed as the capacitive insulating film 92 in each of the holes and the storage electrode 93 made of titanium nitride for example is formed so as to fill up the hole. A capacitor element is formed in a portion in which the storage electrode 93 faces the sidewall of each of the intracellular interconnection wires 50, 5n, 60 and 6n across the capacitive insulating film 92. An interlayer insulating film 99 is formed over an interlayer insulating film 98 covering the uppermost intracellular interconnection wires. Though not shown, an additional interconnection layer and a protective film are further formed above the interlayer insulating film 99 when necessary.

As shown in FIG. 3, in the peripheral circuit region of the present embodiment, an N-type MOS transistor is formed on the P-type silicon substrate 1. The N-type MOS transistor includes: a gate electrode 23 including a polysilicon layer 23a, a tungsten nitride layer 23b, and a tungsten layer 23c; a gate insulating film 14 made of a silicon oxide film; a channel region; an N-type low-concentration diffusion layer; and an N-type high-concentration diffusion layer. Though not shown, a P-type MOS transistor is formed when necessary.

The interlayer insulating films 22, 33, 70, 80 and 71 and the silicon nitride film 32, which are shared between the peripheral circuit region and the memory cell region, are formed to cover these transistors.

A contact plug 34 connected to the high-concentration diffusion layer is formed so as to avoid the gate electrode 23. The contact plug 34 is also connected to an upper interconnection wire 41. The interconnection wire 41 is formed simultaneously with the formation of the bit line 40 of the memory cell by using the same material as the bit line 40. A via plug 200 is formed to extend upwardly from the interconnection wire 41 for the purpose of connection to an upper interconnection wire (i.e., peripheral circuit interconnection wire) 150. The interconnection wire 150 is formed simultaneously with the formation of the intracellular interconnection wire 50 of the memory cell by using the same material (including a titanium nitride layer 150*a*, an aluminum layer 150*b* and a titanium nitride layer 150*c*) as the intracellular interconnection wire 50. A silicon nitride cap layer 150*d* is formed over the interconnection wire 150. A via plug 210 is formed to extend upwardly from the silicon nitride layer 150*d* for the purpose of interconnection between the interconnection layer 150 and an upper interconnection wire 160. The interconnection wire (i.e., peripheral circuit interconnection wire) 160 is formed simultaneously with the formation of the intracellular interconnection wire 60 of the memory cell by using the same material (including a titanium nitride layer 160*a*, an aluminum layer 160*b* and a titanium nitride layer 160*c*) as the intracellular interconnection wire 60. A silicon nitride cap layer 160*d* is formed over the interconnection layer 160.

Further, interlayer insulating films 7*n* and 8*n* (where n is the number of further required layers), via plugs 20*n* and 21*n* and interconnection wires (i.e., peripheral circuit interconnection wires) 15*n* and 16*n* are sequentially formed in accordance with the number of required interconnection layers. The interconnection wire 15*n* is formed simultaneously with the formation of the intracellular interconnection wire 5*n* of the memory cell by using the same material (including a titanium nitride layer 15*na*, an aluminum layer 15*nb*, and a titanium nitride layer 15*nc*) as the intracellular interconnection wire 5*n*. Similarly, the interconnection wire 16*n* is formed simultaneously with the formation of the intracellular interconnection wire 6*n* of the memory cell by using the same material (including a titanium nitride layer 16*na*, an aluminum layer 16*nb*, and a titanium nitride layer 16*nc*) as the intracellular interconnection wire 6*n*. Silicon nitride films 15*nd* and 16*nd* are formed over the respective interconnection wires 15*n* and 16*n*.

The interlayer insulating film 99 is formed over the interlayer insulating film 98 covering the interconnection wire 16*n* and the interlayer insulating film 8*n*. Though not shown, an additional interconnection layer and a protective film are further formed above the interlayer insulating film 99 when necessary.

Figure 11A:
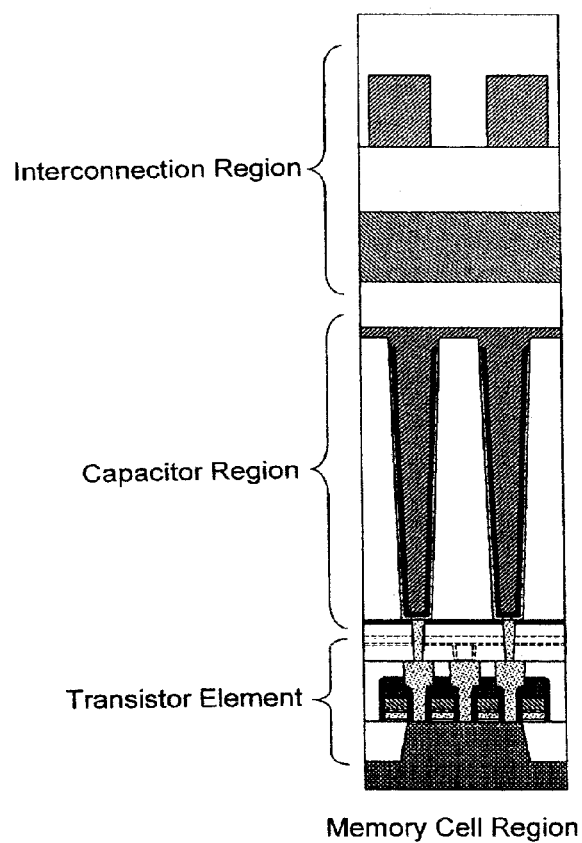
FIG. 11A and FIG. 11B are sectional views showing a DRAM cell region and a peripheral circuit region respectively in a semiconductor device according to the related art.
Figure 11B:
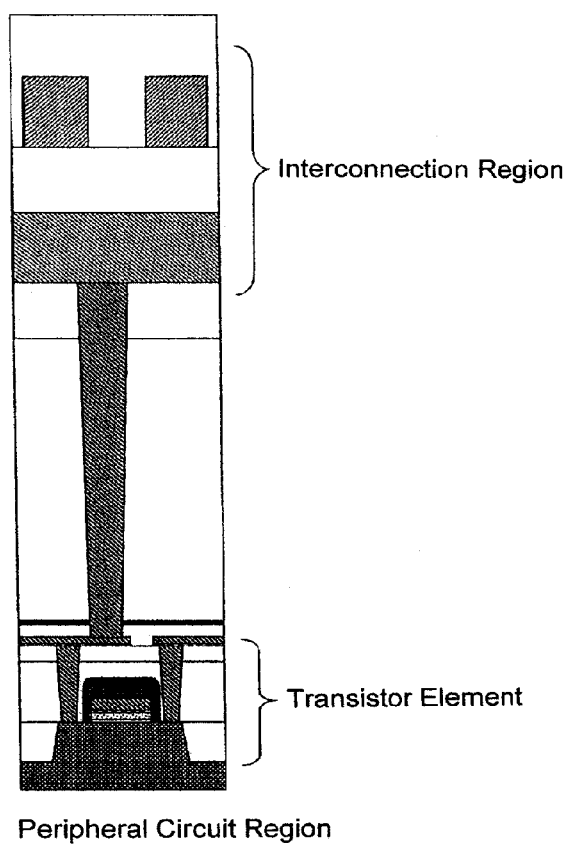

The structure of the above-described peripheral circuit region includes the MOS transistor formed on the silicon substrate, the multi-level interconnection wires, the via plugs interconnecting the interconnection wires, and the interlayer insulating films. As can be seen from comparison with the conventional structure shown in FIG. 11, only the deeply extending via plug is present in the layered region corresponding to the capacitor forming region according to the conventional structure, whereas the interconnection wires are formed in that region according to the present embodiment.

Since the peripheral circuit region can have the same sectional structure as an LSI which does not have any DRAM cell, an LSI with embedded DRAM can be obtained which exhibits satisfactory performance including a reduction in through-hole resistance.

Figure 4:
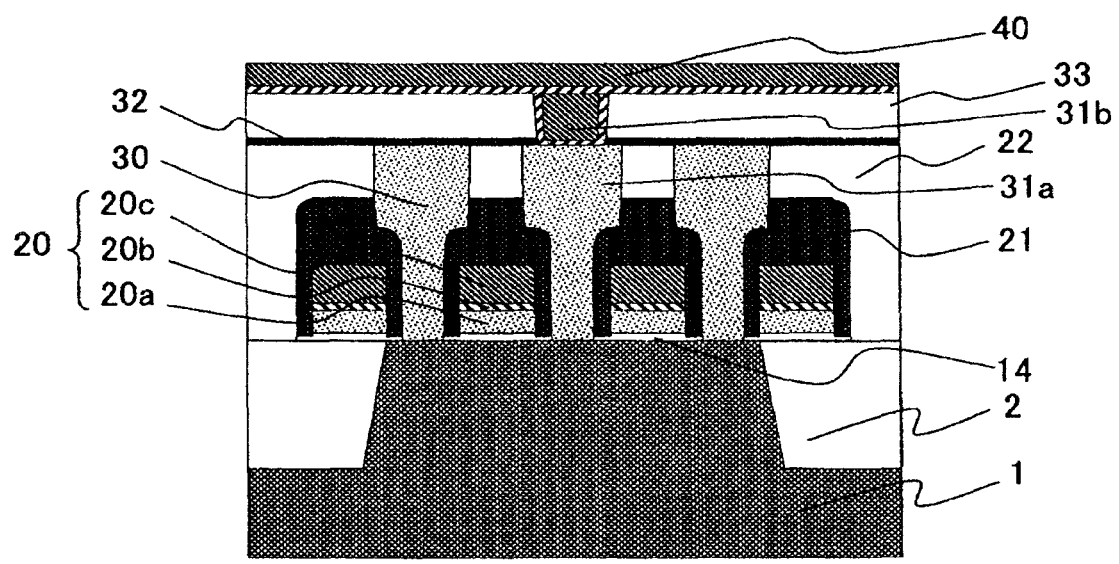
FIG. 4 is a sectional view showing the memory cell region in a state after formation of bit lines for illustrating an exemplary fabrication method according to the present invention.

An exemplary method of fabricating the memory cell region in accordance with the above-described embodiment will be described with reference to FIGS. 4 to 10. FIG. 4 shows a section that corresponds to the section taken on line A-A of FIG. 1. In each of FIGS. 5 to 10, the section extending from the silicon substrate 1 to the interlayer insulating film 22 is taken on line A-A of FIG. 1, while the section extending from the silicon nitride film 32 to the uppermost layer is taken on line B-B of FIG. 1. In the sectional views taken on line B-B, there are transparently shown the bit line contact plug (upper portion) 31*b*, bit line 40, and intracellular interconnection wires 60 and 6*n*.

First, description is directed to a fabrication process performed until the structure shown in FIG. 4 is obtained.

A device isolation region 2 made of an oxide film is formed on the silicon substrate. The surface of the silicon substrate is subjected to ion implantation of a required impurity and then to annealing for activating the impurity.

Subsequently, after formation of the gate oxide film 14 by thermal oxidation, the polysilicon film 20*a*, tungsten nitride film 20*b* and tungsten film 20*c*, which will form the gate electrode, and the silicon nitride film 21, which will form a cap insulating film, are deposited sequentially. This film stack is patterned to form the word lines 20 by using a lithographic technique and a dry etching technique.

Subsequently, an impurity is ion-implanted to form a shallow low-concentration diffusion layer. In turn, a silicon nitride film is formed and then etched back to form a sidewall spacer made of the silicon nitride film on the sidewall of each word line (i.e., gate electrode). Thereafter, the impurity is ion-implanted to form a deep high-concentration diffusion layer.

Subsequently, the interlayer insulating film 22 made of a BPSG film for example is formed so as to fill up the space between adjacent word lines. After planarization by CMP (Chemical Mechanical Polishing) when necessary, contact holes are formed using the lithographic technique and the dry etching technique. In turn, a polysilicon film containing an impurity is formed so as to fill up the contact holes. Subsequently, the polysilicon film is removed from a flat region outside the holes by CMP, to form the contact plugs 30 and 31*a*.

Subsequently, the silicon nitride film 32 which will serve as an etching stopper and the interlayer insulating film 33 made of silicon oxide are formed. Thereafter, a contact hole for forming a bit line contact plug is formed by using the lithographic technique and an etching technique. In turn, a film stack composed of a titanium nitride film and a tungsten film for example is formed so as to fill up this contact hole. Subsequently, the film stack is removed from a flat region outside the hole by CMP, to form the bit line contact plug 31*b*.

Subsequently, a film stack composed of a titanium nitride film and a tungsten film for example is formed and then processed using the lithographic technique and the dry etching technique to form the bit lines 40 perpendicularly intersecting the word lines 20. Simultaneously with the formation of the bit lines 40, the interconnection wires 41 are formed in the peripheral circuit region not shown.

The structure shown in FIG. 4 can be obtained by the process thus described.

Figure 5:
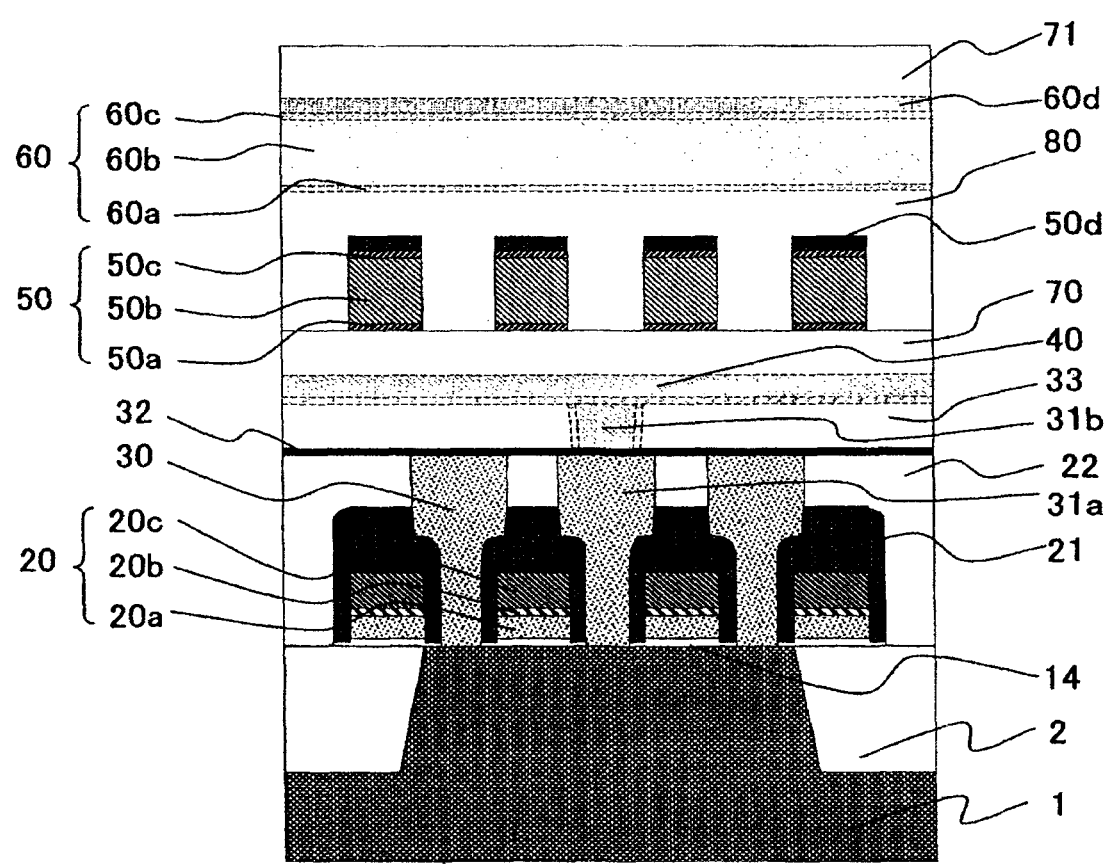
FIG. 5 is a sectional view showing the memory cell region in a state after formation of an intracellular interconnection wire 60 by a process subsequent to the process performed to form the structure shown in FIG. 4.

Next, description is directed to a fabrication process performed until the structure shown in FIG. 5 is obtained.

The interlayer insulating film 70 is formed so as to cover the bit lines 40 and the interconnection wires 41, followed by formation of the via plug 200 for connection to an upper interconnection wire in the non-illustrated peripheral circuit region.

Subsequently, the titanium nitride film 50a, aluminum film 50b and titanium nitride film 50c, which will form the intracellular interconnection wires 50, and the silicon nitride film 50d, which will form a cap insulating film, are formed sequentially. In turn, the intracellular interconnection wires 50 having substantially the same pattern as the word lines 20 are formed using the lithographic technique and the dry etching technique. Simultaneously with the formation of these intracellular interconnection wires, the interconnection wires 150 are formed in the non-illustrated peripheral circuit region.

Subsequently, the interlayer insulating film 80 is formed so as to cover the intracellular interconnection wires 50, followed by formation of the via plug 210 for connection to an upper interconnection wire in the non-illustrated peripheral circuit region.

Subsequently, the titanium nitride film 60a, aluminum film 60b and titanium nitride film 60c, which will form the intracellular interconnection wires 60, and the silicon nitride film 60d, which will form a cap insulating film, are formed sequentially. In turn, the intracellular interconnection wires 60 having substantially the same pattern as the bit lines 40 are formed using the lithographic technique and the dry etching technique. Simultaneously with the formation of these intracellular interconnection wires, the interconnection wires 160 are formed in the non-illustrated peripheral circuit region. Subsequently, the interlayer insulating film 71 is formed so as to cover the interconnection wires 160 and the intracellular interconnection wires 60.

The structure shown in FIG. 5 can be obtained by the process thus described.

Figure 6:
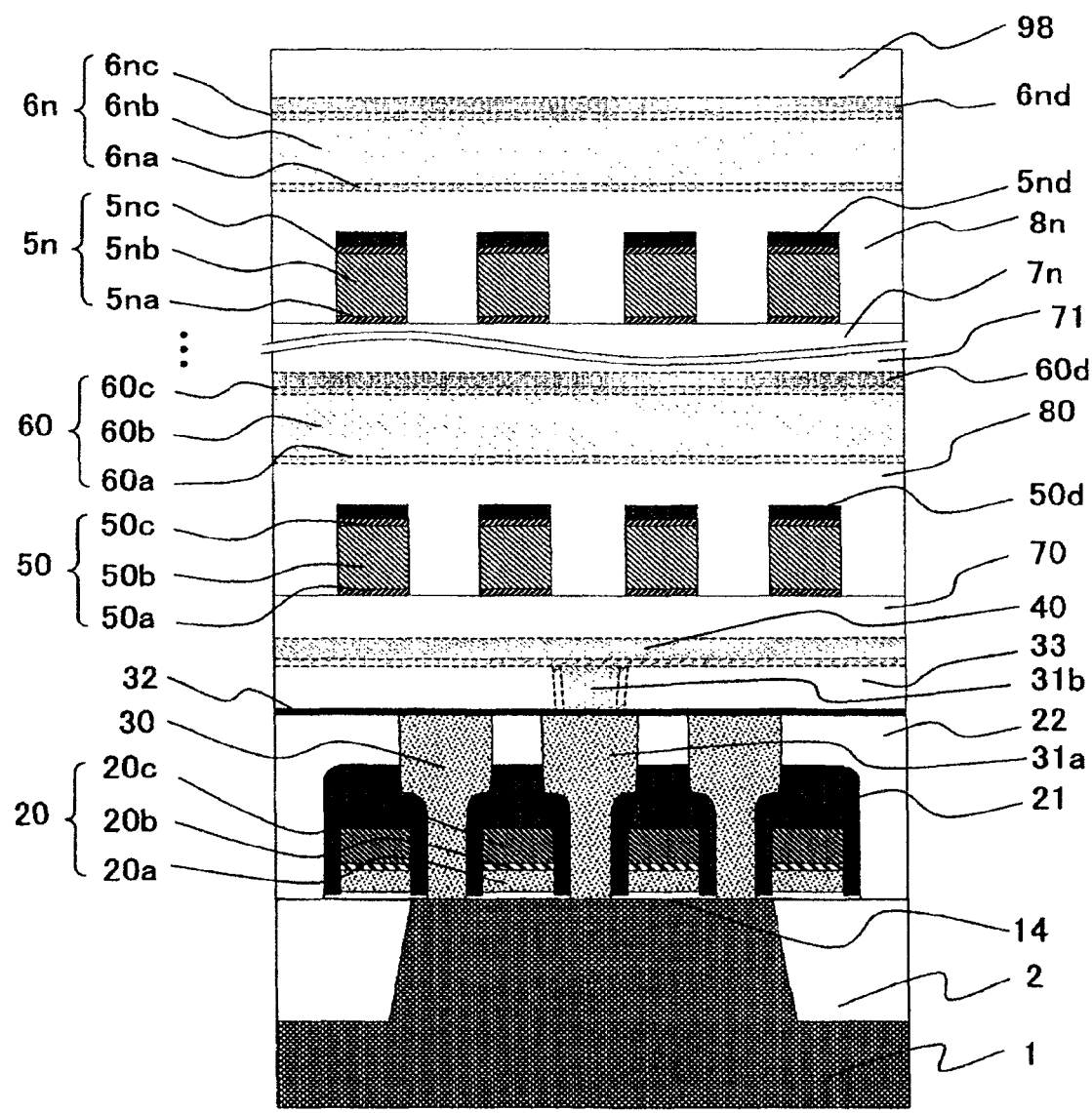
FIG. 6 is a sectional view showing the memory cell region in a state after formation of an intracellular interconnection wire 6n by a process subsequent to the process performed to form the structure shown in FIG. 5.

Thereafter, as shown in FIG. 6, the intracellular interconnection wires $5n$ and $6n$ are sequentially formed in accordance with the number n of further required interconnection layers, as described below.

After formation of the interlayer insulating film $7n$, the via plug $20n$ for connection to an upper interconnection wire is formed to extend through the interlayer insulating film $7n$ in the non-illustrated peripheral circuit region.

Subsequently, the titanium nitride film $5na$, aluminum film $5nb$ and titanium nitride film $5nc$, which will form the intracellular interconnection wires $5n$, and the silicon nitride film $5nd$, which will form a cap insulating film, are formed sequentially. In turn, the intracellular interconnection wires $5n$ having substantially the same pattern as the word lines 20 are formed using the lithographic technique and the dry etching technique. Simultaneously with the formation of the intracellular interconnection wires $5n$, the interconnection wires $15n$ are formed in the non-illustrated peripheral circuit region.

Subsequently, the interlayer insulating film $8n$ is formed so as to cover the intracellular interconnection wires $5n$, followed by formation of the via plug $21n$ for connection to an upper interconnection wire in the non-illustrated peripheral circuit region.

Subsequently, the titanium nitride film $6na$, aluminum film $6nb$ and titanium nitride film $6nc$, which will form the intracellular interconnection wires $6n$, and the silicon nitride film $6nd$, which will form a cap insulating film, are formed sequentially. In turn, the intracellular interconnection wires $6n$ having substantially the same pattern as the bit lines 40 are formed using the lithographic technique and the dry etching technique. Simultaneously with the formation of the intracellular interconnection wires $6n$, the interconnection wires $16n$ are formed in the non-illustrated peripheral circuit region.

Subsequently, the interlayer insulating film 98 is formed so as to cover the intracellular interconnection wires $6n$ as the uppermost interconnection layer.

The structure shown in FIG. 6 can be obtained by the process thus described.

Figure 7:
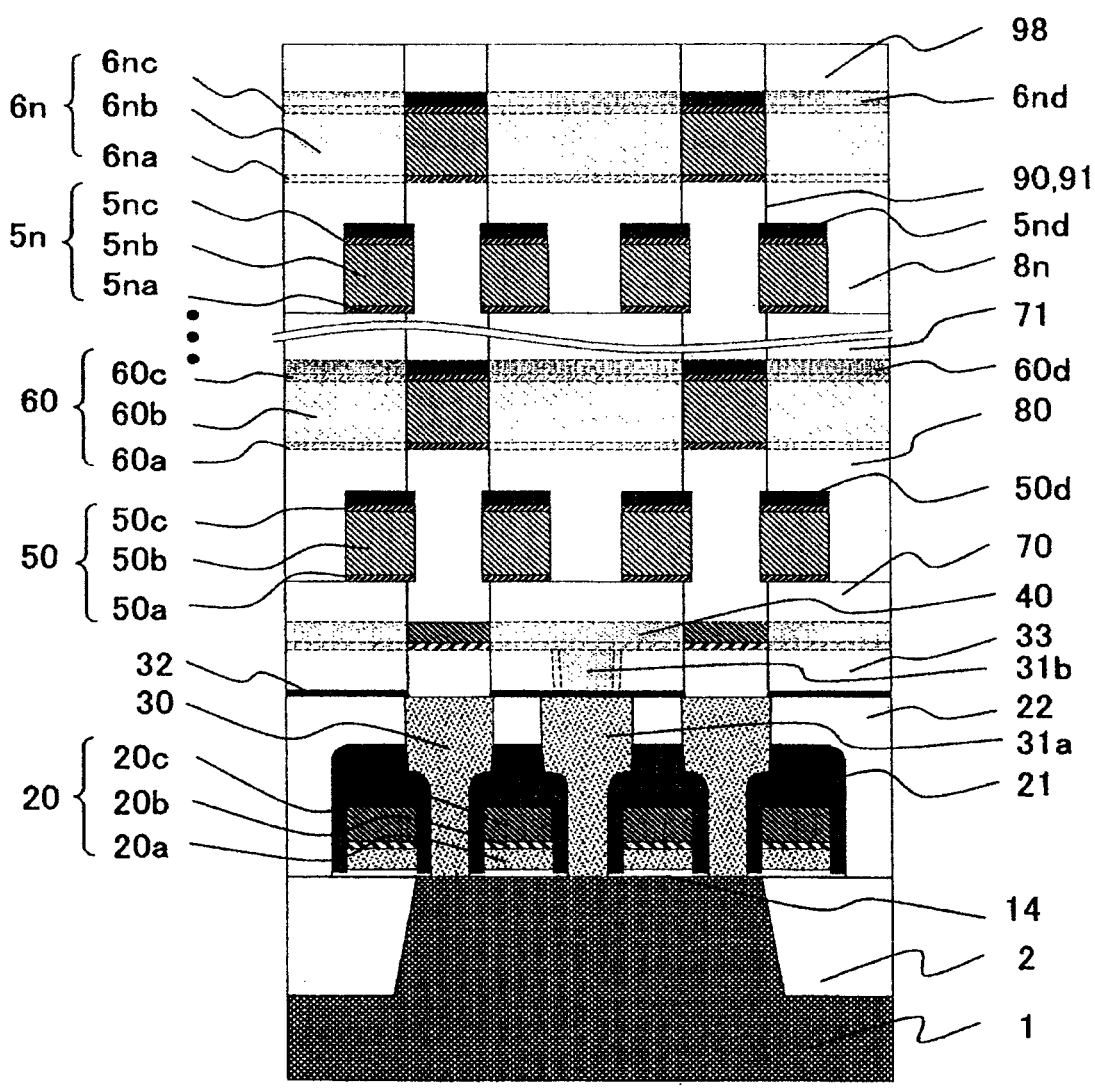
FIG. 7 is a sectional view showing the memory cell region in a state after formation of a capacitor hole by a process subsequent to the process performed to form the structure shown in FIG. 6.

The following description is directed to the fabrication process performed until the structure shown in FIG. 7 is obtained.

In the layout plane, holes are formed to open regions each of which encompasses a region free of the bit lines 40 and the intracellular interconnection wires 50, $5n$, 60 and $6n$ (i.e., region in which the space between adjacent bit lines and the space between adjacent intracellular interconnection wires in each layer overlap each other). These holes are formed using the lithographic technique and the dry etching technique. In the dry etching, by selecting an etching condition that the etching rate of silicon nitride film is about 1/50 as high as that of silicon oxide film, the cap insulating films 50d, $5nd$, 60d and $6nd$, each composed of a silicon nitride film, on the respective intracellular interconnection wires can hardly be etched. Also, etching can be stopped with high controllability by the silicon nitride film 32 covering the contact plugs 30. Thereafter, dry etching is performed under an etching condition that the etching rate of the silicon nitride film 32 is relatively high, to remove the portions of the silicon nitride film 32 which lie on the contact plugs 30.

The structure shown in FIG. 7 can be obtained by the process thus described. In the holes thus formed, side surfaces of the bit lines 40 and intracellular interconnection wires 50, $5n$, 60 and $6n$ are exposed.

Figure 8:
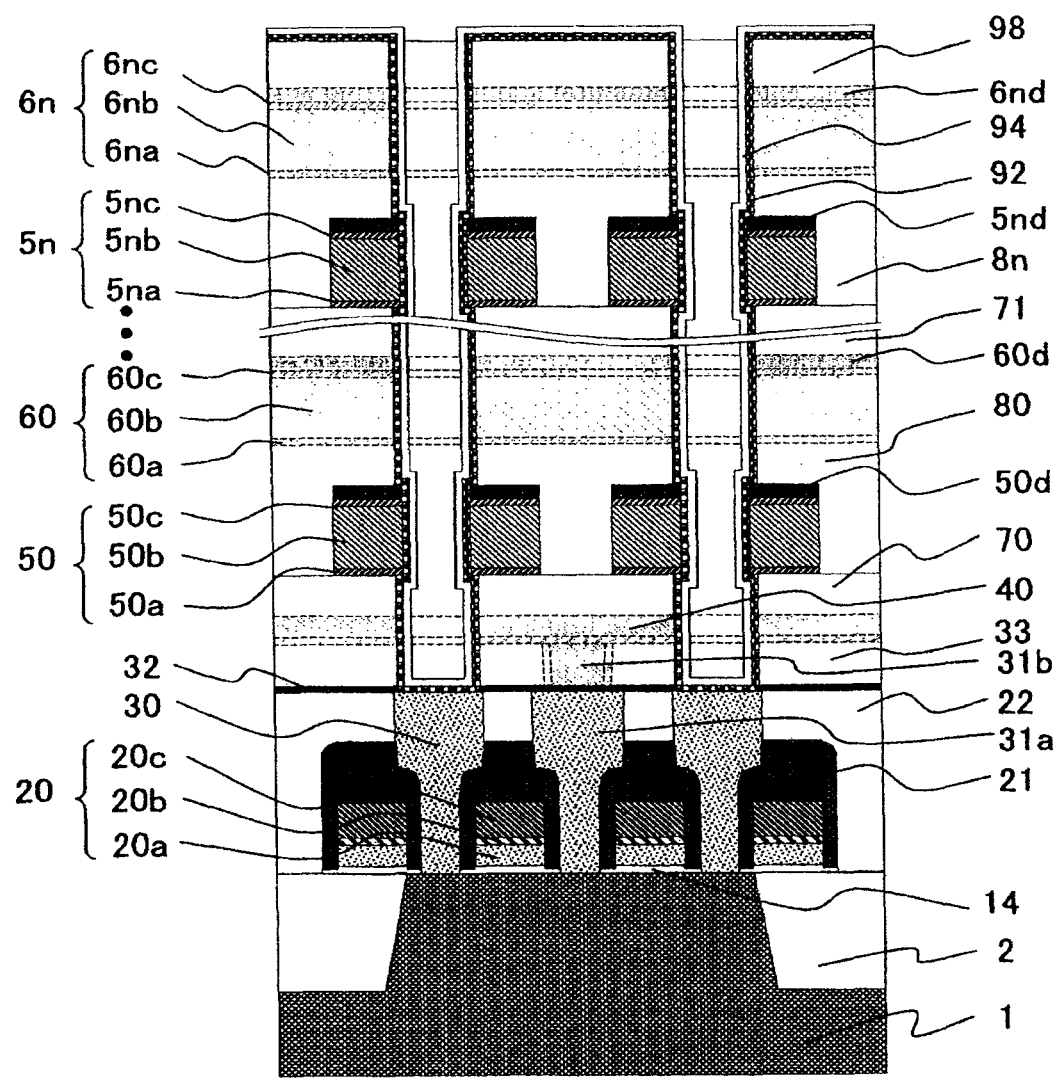
FIG. 8 is a sectional view showing the memory cell region in a state after formation of a capacitive insulating film by a process subsequent to the process performed to form the structure shown in FIG. 7.

Subsequently, the capacitive insulating film 92 made of a film stack composed of an aluminum oxide film and a hafnium oxide film, and a protective oxide film 94 are sequentially formed over the surface of the structure including the inner surfaces of the holes, as shown in FIG. 8.

Figure 9:
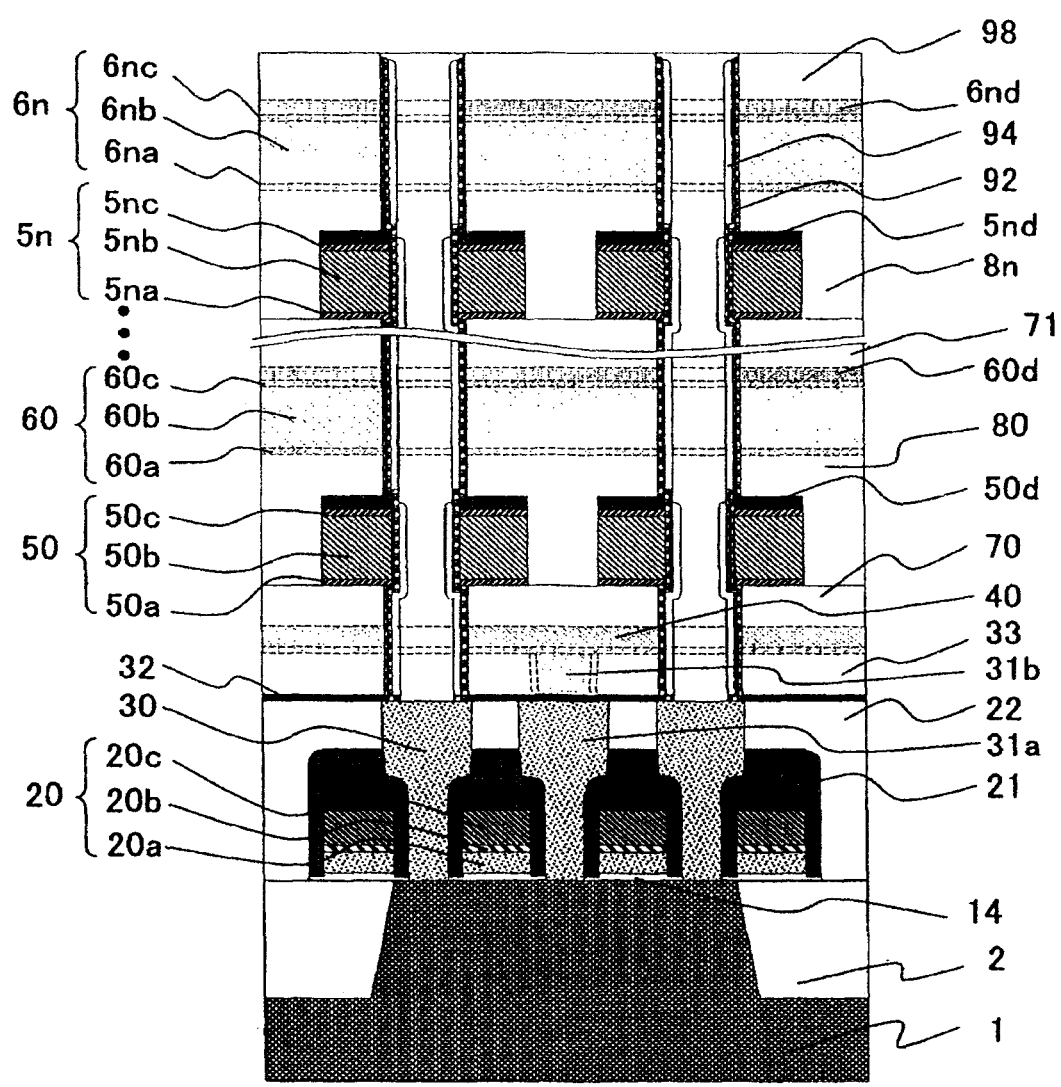
FIG. 9 is a sectional view showing the memory cell region in a state after etching back of the capacitive insulating film by a process subsequent to the process performed to form the structure shown in FIG. 8.
Figure 10:
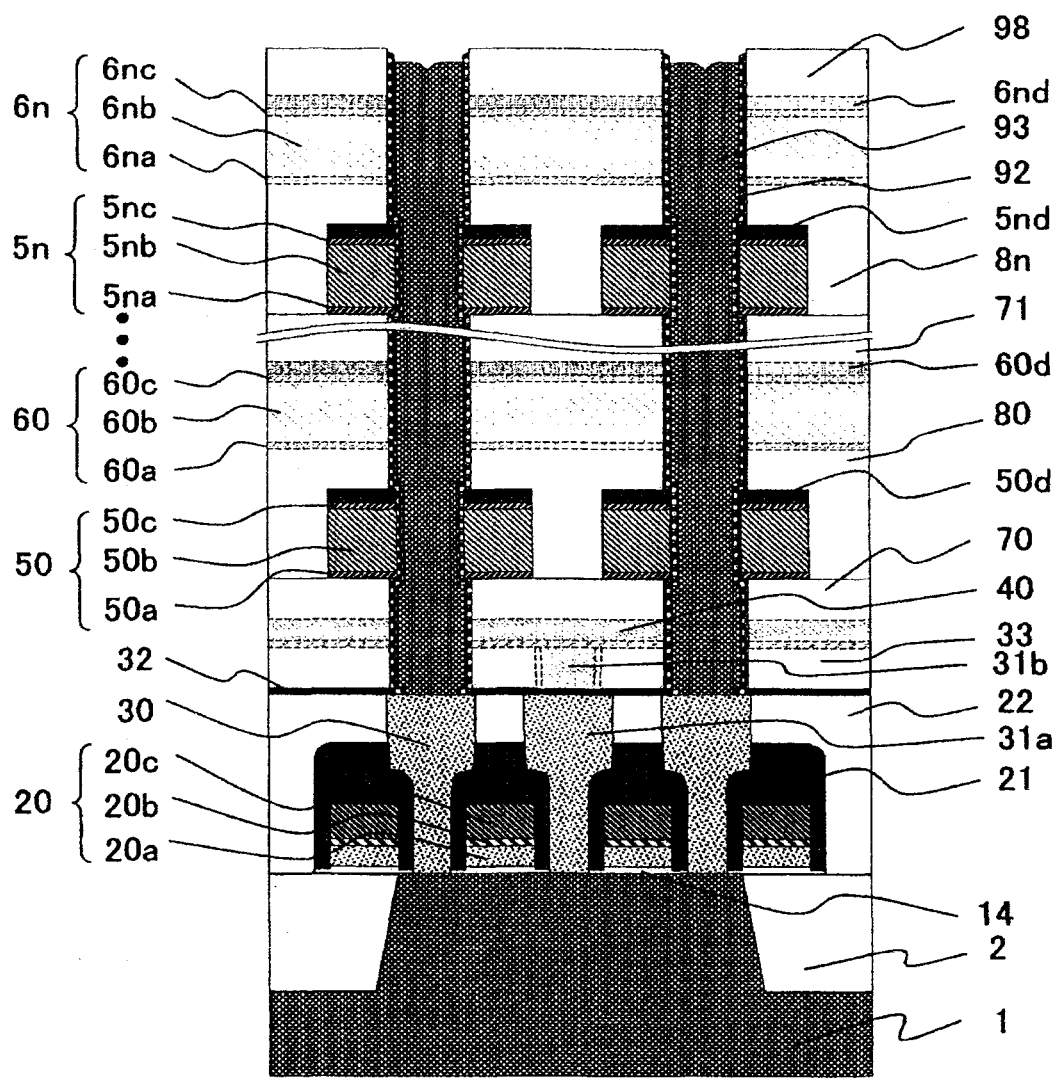
FIG. 10 is a sectional view showing the memory cell region in a state after formation of a capacitor by a process subsequent to the process performed to form the structure shown in FIG. 9.

Subsequently, an etch back process is performed using an anisotropic dry etching technique to remove the capacitive insulating film 92 and the protective oxide film 94 from the region outside the holes and from the bottom of each hole, as shown in FIG. 9.

Subsequently, the protective oxide film 94 is removed from the inside of each hole by wet etching using hydrofluoric acid. Thereafter, a titanium nitride film for example is formed so as to fill up the holes and, subsequently, titanium nitride is removed from the surface region outside the holes by dry etching technique, to form the storage electrodes 93. In this way, the structure shown in FIG. 10 can be obtained.

Thereafter, the interlayer insulating film 99 is formed and, when necessary, an additional interconnection layer and an additional protective film are further formed. Thus, a semiconductor product including DRAM and the peripheral circuit can be obtained.

While the capacitors are formed by forming holes after the formation of all the required intracellular interconnection wires according to the foregoing fabrication process, the capacitor formation process may be divided into plural steps. For example, when six layers of intracellular interconnection wires are needed, it is possible to form a portion of the capacitors after the formation of three layers of intracellular interconnection wires and then form the rest of the capacitors after the formation of the remaining three layers of intracellular interconnection wires. By so doing, each of the divided process steps can ensure sufficient processing precision, thereby making it possible to form a DRAM region having a desired storage capacitance easily with precision.

The present invention is not limited to the foregoing exemplary embodiments and is applicable to semiconductor devices having DRAM cells in general.

The invention claimed is:

1. A semiconductor device comprising:
   a substrate;
   a first interlayer insulating film over the substrate;
   a first interconnection wire over the first interlayer insulating film, the first interconnection wire being extending in a first direction;
   a second interlayer insulating film covering the first interconnection wire;
   a second interconnection wire over the second interlayer insulating film, the second interconnection wire being extending in a second direction intersecting the first direction;
   a third interlayer insulating film covering the second interconnection wire; and
   a hole extending through the first, second and third interlayer insulating films such that a side surface of the second interconnection wire is exposed.

2. The semiconductor device according to claim 1, further comprising:
   a dielectric film formed on an inner wall of the hole; and
   a conductor formed in the hole, whereby a capacitor is formed using the conductor, the second interconnection wire and the dielectric film sandwiched therebetween.

3. The semiconductor device according to claim 1, further comprising:
   a third interconnection wire over the third interlayer insulating film, the third interconnection wire being extending in the first direction;
   a fourth interlayer insulating film covering the third interconnection wire, wherein
   the hole extends through the first, second, third and fourth interlayer insulating films such that side surfaces of the second and third interconnection wires are exposed.

4. A method of fabricating a semiconductor device, comprising:
   forming a first interlayer insulating film over a substrate;
   forming a first interconnection wire over the first interlayer insulating film, the first interconnection wire being extending in a first direction;
   forming a second interlayer insulating film covering the first interconnection wire;
   forming a second interconnection wire over the second interlayer insulating film, the second interconnection wire being extending in a second direction intersecting the first direction;
   forming a third interlayer insulating film covering the second interconnection wire; and
   forming a hole extending through the first, second and third interlayer insulating films such that a side surface of the second interconnection wire is exposed.

5. The method of fabricating a semiconductor device according to claim 4, further comprising:
   forming a dielectric film formed on an inner wall of the hole; and
   forming a conductor formed in the hole, whereby a capacitor is formed using the conductor, the second interconnection wire and the dielectric film sandwiched therebetween.

6. The method of fabricating a semiconductor device according to claim 4, further comprising:
   forming a third interconnection wire over the third interlayer insulating film, the third interconnection wire being extending in the first direction;
   forming a fourth interlayer insulating film covering the third interconnection wire, wherein
   the hole extends through the first, second, third and fourth interlayer insulating films such that side surfaces of the second and third interconnection wires are exposed.

* * * * *